(12) United States Patent
Glenn

(10) Patent No.: US 6,476,476 B1
(45) Date of Patent: Nov. 5, 2002

(54) INTEGRATED CIRCUIT PACKAGE INCLUDING PIN AND BARREL INTERCONNECTS

(75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/932,109

(22) Filed: Aug. 16, 2001

(51) Int. Cl.[7] ................................................ H01L 23/02
(52) U.S. Cl. ...................... 257/686; 257/723; 257/773
(58) Field of Search ................................ 257/686, 685, 257/723, 777–778, 773–774; 438/109–110, 121; 439/69; 361/790

(56) References Cited

U.S. PATENT DOCUMENTS 5,579,207 A * 11/1996 Hayden et al.
6,093,209 A *  7/2000 Kwon et al.
6,278,284 B1 *  8/2001 Mori et al.

* cited by examiner

Primary Examiner—Olik Chaudhuri
Assistant Examiner—DiLinh Nguyen
(74) Attorney, Agent, or Firm—Skjerven Morrill LLP; James E. Parsons; Celisa Date

(57) ABSTRACT

Stackable integrated circuit packages with pin and barrel interconnects are disclosed, along with methods of making such packages. In an exemplary embodiment, a package includes a molded plastic body, metal coated barrels on an upper side of the body, and metal coated pins on a lower side of the body. The pins are arranged coaxial with respective barrels. An integrated circuit is mounted on the upper side of the body. Metal traces electrically couple the integrated circuit to the barrels. Vias through the body electrically connect the metal coated barrels to respective metal coated pins. Two or more packages may be stacked and electrically coupled together by inserting the pins of a top package into the barrels of a lower package. The pins of the lower package may be soldered to a conventional printed circuit board, or may be mounted on a mounting substrate including corresponding metal coated barrels.

37 Claims, 13 Drawing Sheets

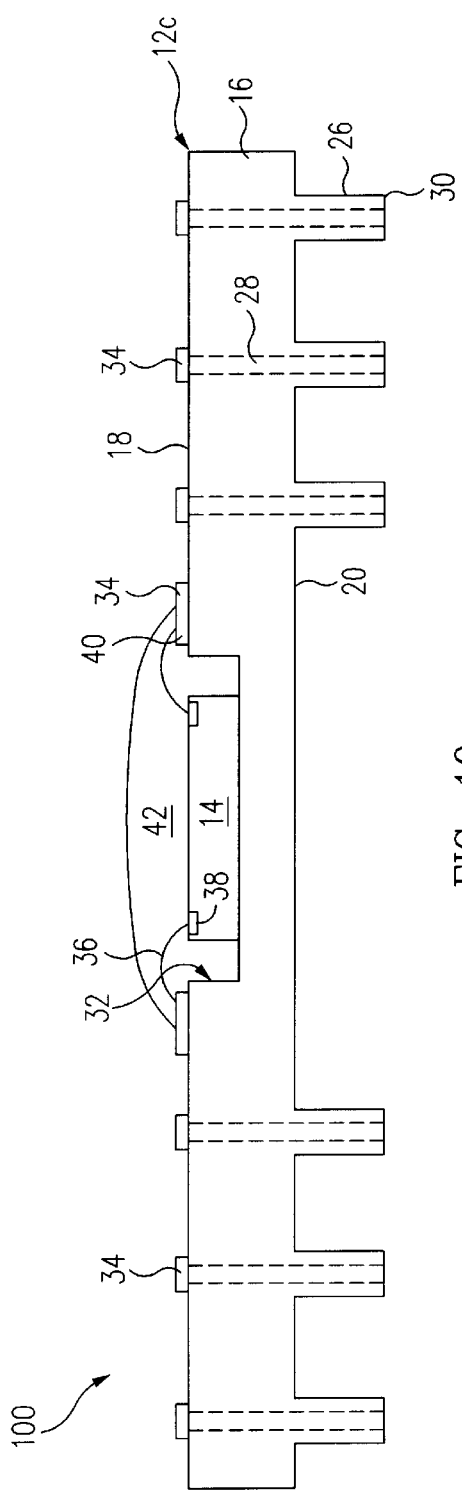
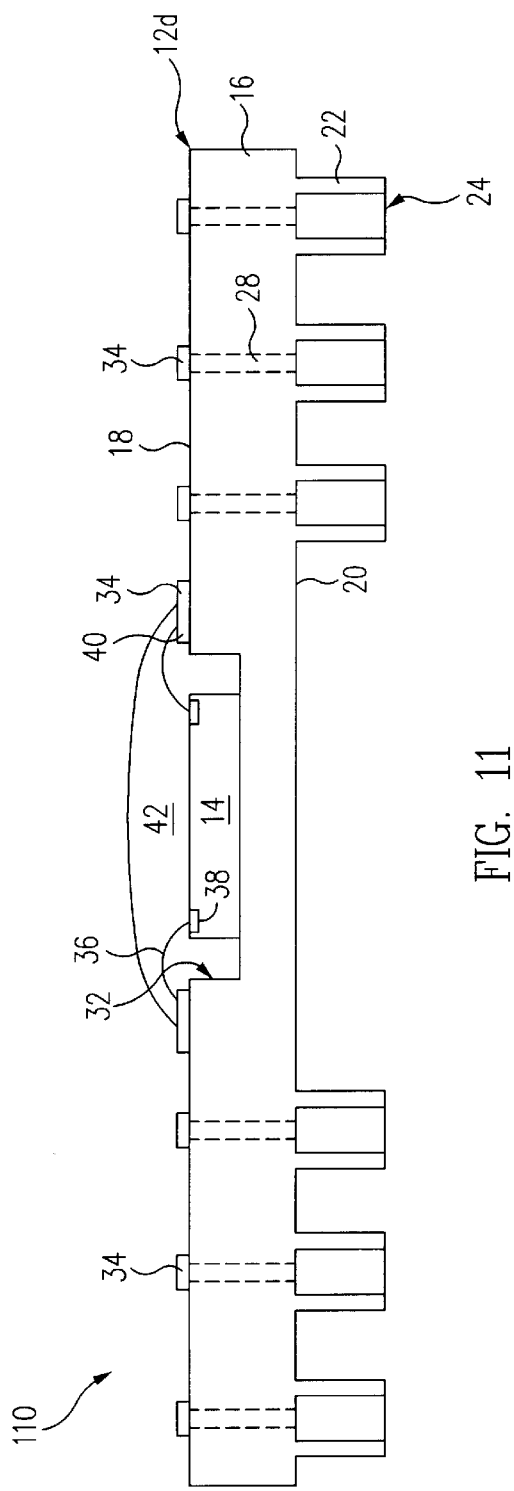
FIG. 10
FIG. 11

INTEGRATED CIRCUIT PACKAGE INCLUDING PIN AND BARREL INTERCONNECTS

FIELD OF THE INVENTION

The present invention relates to packages for integrated circuits.

BACKGROUND

In the field of integrated circuit packaging, it is known to include a plurality of integrated circuits (also called chips or semiconductor chips) in a single package body. Including a plurality of integrated circuits in one package allows an increase in the package density and function without a significant increase in the area of a printed circuit board that is occupied by the package upon mounting thereon.

A significant disadvantage of conventional packages, even those including a plurality of integrated circuits, is that further increases in package density per unit area of the printed circuit board are not easily attainable. For example, if a package includes two sixteen megabit memory integrated circuits (for a total of thirty-two megabits), then increasing the total amount of memory to 128 megabits would require additional area on the printed circuit board to mount three additional thirty-two megabit packages.

Artisans have attempted to address this disadvantage by stacking separate packages on top of each other to conserve the area of printed circuit boards. Conventional stacking methods, however, require that the packages be soldered together. This can be difficult due to a need to accurately align the package, and maintain the alignment, prior to soldering. Moreover, separating the stacked, soldered packages without damaging them is difficult.

Accordingly, packages with improved stacking capabilities are desirable.

SUMMARY OF THE INVENTION

The present invention includes integrated circuit packages that may be easily stacked upon another similarly constructed package so as to form electrical and physical connections with the other package. The stacked packages may contain the same or different types of integrated circuits. For example, two packages with memory chips may be stacked, or a package including a memory chip may be stacked with a package including a microprocessor chip. The package design provides the user with flexibility in deciding how many and what types of packages to stack. The package design also increases the functionality of a given area of a printed circuit board, or other mounting substrate, upon which the packages are stacked.

In accordance with one embodiment of the present invention, a substrate for such an integrated circuit package includes a molded plastic body including an integrated circuit mounting region, and a plurality of metal coated barrels each extending vertically and integrally from the body. The substrate also includes a plurality of metal coated pins each extending vertically and integrally from the body and aligned co-axially with a respective one of the barrels. At least some of the metal coated barrels are electrically coupled to respective ones of the metal coated pins. The substrate also includes a plurality of electrically conductive traces each electrically coupled to at least one metal coated barrel.

In accordance with another embodiment of the present invention, an integrated circuit package using an embodiment of the above-described substrate includes an integrated circuit mounted on the body and electrically coupled to at least some of the traces. The integrated circuit may be electrically coupled to the traces by a plurality of bond wires. The integrated circuit may be encapsulated, at least in part, by an encapsulant material.

Another embodiment of the present invention includes a stack of integrated circuit packages. The stack includes a first integrated circuit package including a first integrated circuit mounted on a first molded plastic body. The first molded plastic body includes a plurality of integral metal coated barrels each electrically coupled to the first integrated circuit. The stack also includes a second integrated circuit package including a second integrated circuit mounted on a second molded plastic body. The second molded plastic body includes a plurality of integral metal coated pins each electrically coupled to the second integrated circuit. The first and second integrated circuit packages are stacked, and the pins of the second integrated circuit package are within, and electrically coupled to, respective ones of the barrels of the first integrated circuit package.

The present invention also includes a mounting substrate upon which one or more of the above-described integrated circuit packages may easily be mounted. The mounting substrate includes a molded plastic sheet, a plurality of metal coated barrels each extending vertically and integrally from the sheet, and an electrically conductive connector extending from the sheet. The connector is adapted to couple the substrate, electrically and physically, to circuitry external to the substrate. The mounting substrate also includes a plurality of electrically conductive traces each electrically coupled at first ends to respective metal coated barrels. At least some of the traces are electrically coupled at opposite second ends to the electrically conductive connector.

In an exemplary embodiment of a method of making the above-described integrated circuit package a molded plastic substrate is provided. The substrate includes a plurality of metal coated barrels, each extending vertically and integrally from a body of the substrate. The substrate also includes a plurality of electrically conductive traces on the body, each electrically coupled to at least one metal coated barrel. An integrated circuit is mounted on the body, and electrically coupled to at least some of the traces. In some embodiments, the molded plastic substrate may include a plurality of interconnected package sites arranged in an array, so that a plurality of packages may be fabricated in parallel and then singulated.

The present invention is best understood by reference to the following detailed description when read in conjunction with the accompanying drawings.

BRIEF DESCRIPTION OF THE DRAWINGS

FIG. 10 is a cross-sectional side view of a stackable integrated circuit package in accordance with an alternative embodiment of the present invention.

FIG. 11 is a cross-sectional side view of a stackable integrated circuit package in accordance with an alternative embodiment of the present invention.

Common reference numerals are used throughout the drawings and detailed description to indicate like elements.

DETAILED DESCRIPTION

The structures and methods disclosed herein are similar to those disclosed in U.S. application Ser. No. 09/881,344, entitled "Integrated Circuit Package Having Posts For Connection To Other Packages And Substrates," filed Jun. 13, 2001, and to U.S. application Ser. No. 09/827,619, entitled "Semiconductor Package With Molded Substrate And Recessed Input/Output Terminals," filed Apr. 6, 2001, both of which applications are incorporated herein by reference.

Figure 1:
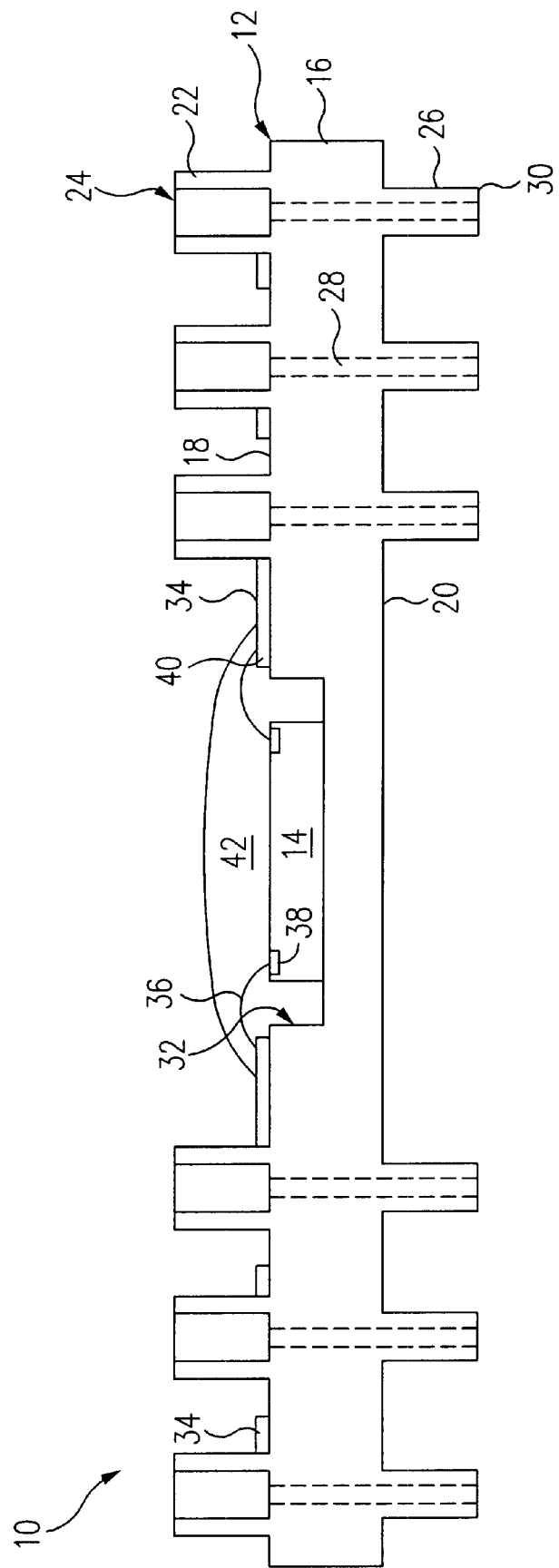
FIG. 1 is a cross-sectional side view of a stackable integrated circuit package in accordance with one embodiment of the present invention.

FIG. 1 is a cross-sectional side view of a stackable integrated circuit package 10 in accordance with one embodiment of the present invention. The design of package 10 enables a plurality of packages 10 to be physically and electrically interconnected in a stack mounted on, for example, a printed circuit board.

Package 10 includes a substrate 12 upon which an integrated circuit 14 is mounted. Substrate 12 includes a substantially planar, insulative, molded plastic body 16, a plurality of plastic barrels 22, and a plurality of plastic pins 26. Substrate 12 may be formed by injection molding of a liquid crystal polymer ("LCP") material or of another plastic material. The material selected for substrate 12 should be able to withstand the temperatures of conventional solder reflowing operations. Substrate 12 may also include electrically conductive metallizations, discussed in more detail below.

Body 16 includes an upper side 18 and an opposite lower side 20. Plastic barrels 22 project vertically from upper side 18. Barrels 22 are hollow cylinders, each with an opening 24 at the end farthest from upper side 18. Plastic pins 26 project vertically from lower side 20. Each of pins 26 is cylindrical and aligned coaxial with a respective one of barrels 22. Barrels 22 and pins 26 are formed of the same material as body 16 and are integral with body 16, and are formed in the same molding step. Each of a plurality of vias 28 is coaxial with a respective barrel 22 and a respective pin 26. Each via 28 extends from the bottom end of a respective barrel 22 at side 18, through body 16, through a respective pin 26, to an end 30 of pin 26 farthest from lower side 20. The number of barrels 22, pins 26, and vias 28 will vary with the functionality of integrated circuit 14.

Figure 2:
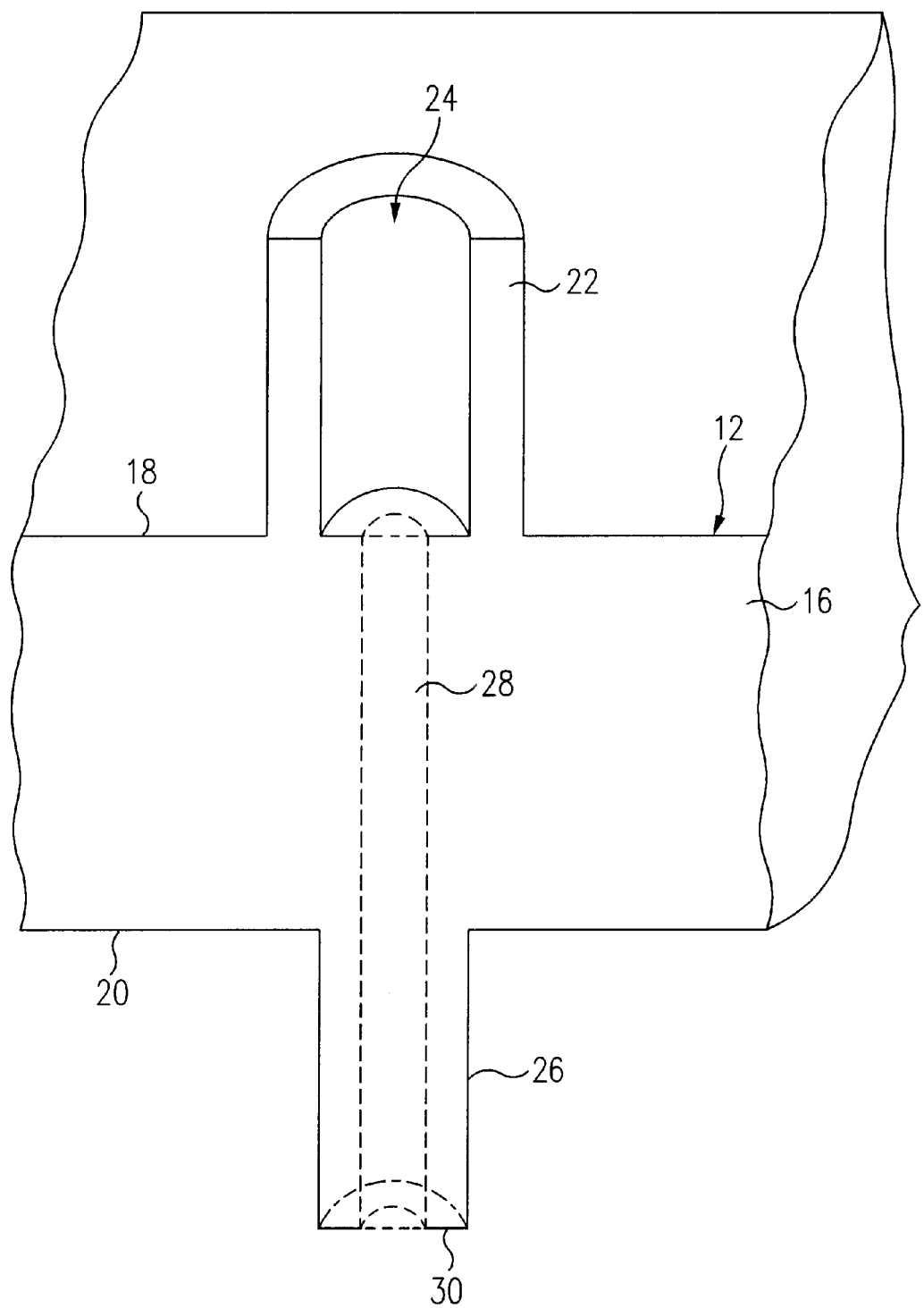
FIG. 2 is a perspective cross-sectional side view showing detail of a portion of the substrate including an exemplary barrel, pin, and via coaxial configuration of the package of FIG. 1.

FIG. 2 is a perspective cross-sectional side view showing detail of a portion of substrate 12 including an exemplary barrel 22, pin 26, and via 28 coaxial configuration of package 10 of FIG. 1. In this embodiment, barrels 22 are plated with a metal coating on all exterior and interior surfaces. Pins 26 are plated with the metal coating on all exterior surfaces. The metal coating also fills each via 28. Thus, the metal coating of each barrel 22 is electrically coupled to the metal coating of a respective, coaxial, oppositely oriented pin 26 by a respective via 28 extending between them.

The diameter of each via 28, which may be 0.05–0.2 mm, is less than the diameter of each pin 26, which may be 0.5–2 mm. The inner diameter of the metal coated barrels 22 are precisely sized to snugly accept metal coated pins 26 of another package 10, thereby allowing stacking of multiple packages 10.

As shown in FIG. 1, the inner sidewalls of barrels 22 and the exterior sidewalls of pins 26 are orthogonal to sides 18 and 20, respectively. Alternatively, a small draft may be incorporated into the inner sidewalls of barrels 22, and into the exterior sidewalls of pins 26, to form tighter, albeit still non-permanent, connections between separate packages 10. For example, the diameters of the inner sidewalls of barrels 22 may be slightly smaller at openings 24 than at side 18. And, the diameters of the exterior sidewalls of pins 26 may be slightly smaller at side 20 than at ends 30.

Referring back to FIG. 1, integrated circuit 14 is mounted in a recess 32 in upper side 18 of body 16. A conventional die attach adhesive, such as epoxy, tape, or an adhesive film, may be used to attach integrated circuit 14 to body 16. Integrated circuit 14 is electrically coupled to a plurality of electrically conductive traces 34 on side 18 of body 16 by a plurality of bond wires 36, each electrically coupled between an electrically conductive bond pad 38 of integrated circuit 14 and a leadfinger 40 of a respective trace 34. Each trace 34 is coupled to the metal coating of a respective barrel 22. Leadfingers 40, traces 34, and the metal coatings lining barrels 22, vias 28, and pins 26 thus form conductive paths (to which integrated circuit 14 is coupled) on and through substrate 12 of package 10. Alternatively, a plurality of integrated circuits 14 could be provided in recess 32. Further, passive devices (such as resistors, capacitors, or inductors) could be electrically connected to integrated circuit 14 in recess 32, or to traces 34 on body 16.

A hardened encapsulant 42 on upper side 18 fills recess 32 and covers integrated circuit 14, bond wires 36, and leadfingers 40. Encapsulant 42 is insulative and protects integrated circuit 14 from the environment. Encapsulant 42 may be Hysol® 4450 or 4423 encapsulants from the Dexter Hysol Company of Industry, Calif., or some other conventional encapsulant. Encapsulant 42 may be omitted, or replaced with an opaque or transparent planar lid attached onto upper side 18 that covers recess 32 and integrated circuit 14, depending on the application.

Figure 3:
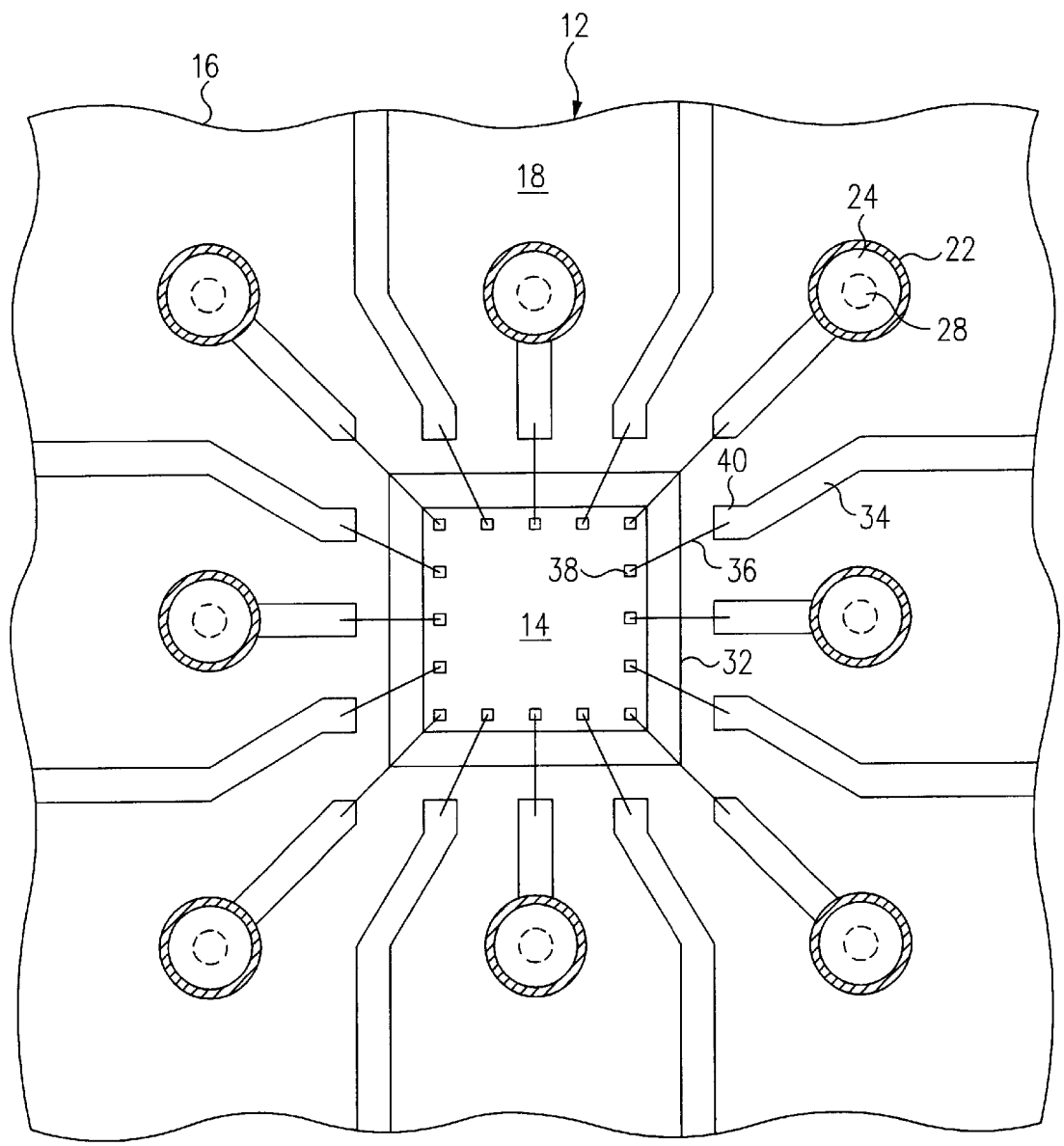
FIG. 3 is a plan view of part of the upper side of the body of the package of FIG. 1.

FIG. 3 is a plan view of a subportion of upper side 18 of body 16 of package 10 of FIG. 1. In the embodiment of FIG. 3, integrated circuit 14 includes sixteen bond pads 38 electrically coupled to leadfingers 40 of respective traces 34 by bond wires 36. The end of each trace 34 opposite to leadfinger 40 is coupled to the metal coating of a respective barrel 22, which is aligned co-axially with a respective via 28. The metal coating on each barrel 22 extends up the exterior sidewall of barrel 22, over the outer end into opening 24, and down the interior sidewall of barrel 22 to the bottom of barrel 22 at side 18. At the bottom of barrel 22 at side 18, the metal coating integrally connects to the metal coating of via 28, eventually leading to a respective pin 26. In some embodiments, the metal coating on the exterior sidewall of barrel 22 may extend onto the surface of upper side 18 surrounding barrel 22 to facilitate electrical coupling of the metal coating to the respective trace 34.

Figure 4:
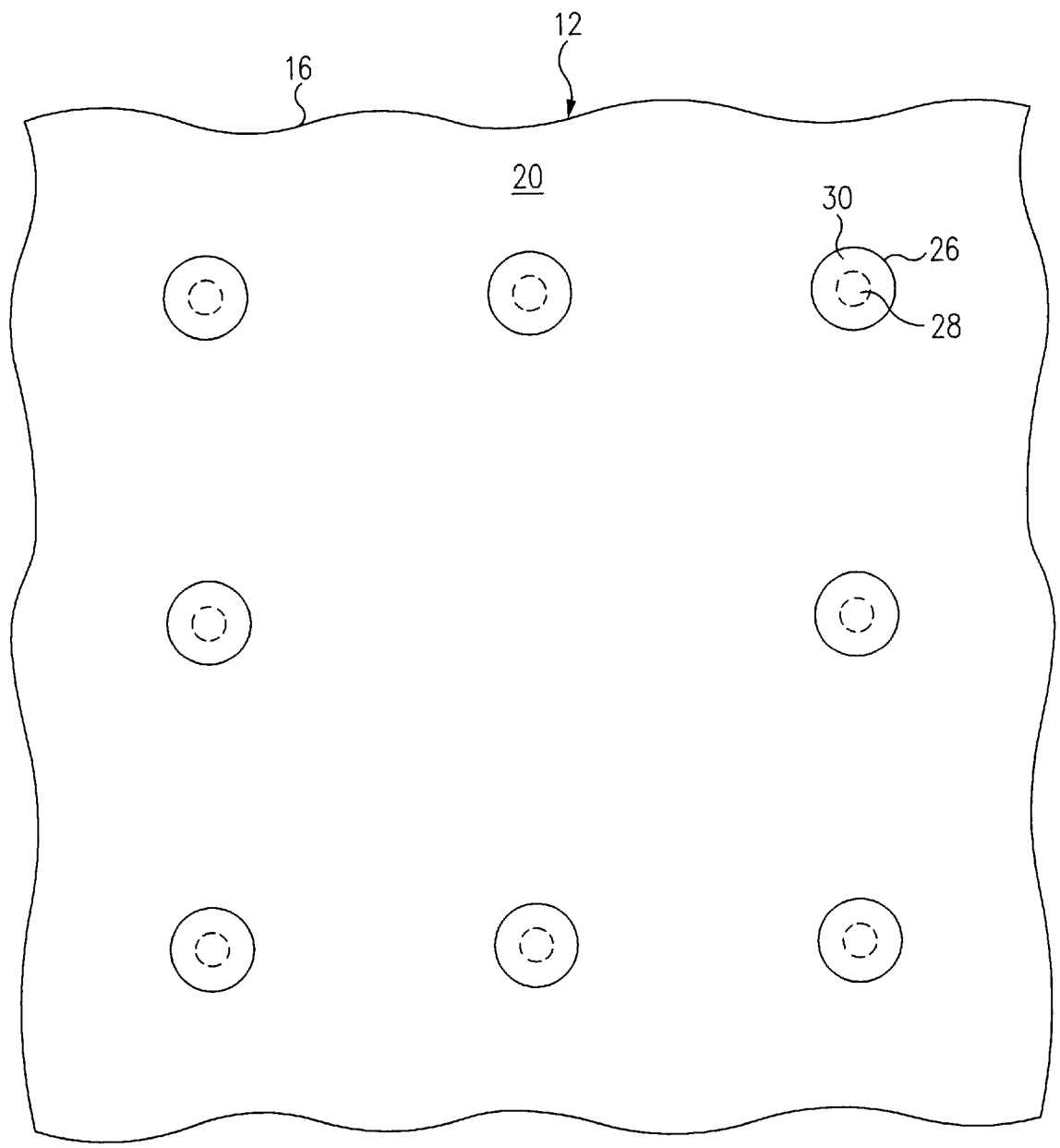
FIG. 4 is a plan view of part of the lower side of the body of the package of FIG. 1.

FIG. 4 is a plan view of a subportion of lower side 20 of body 16 of package 10 of FIG. 1. FIG. 4 shows the coaxial alignment of each pin 26 with its respective via 28, so that each pin 26 is located on lower side 20 opposite to, and coaxial with, a respective barrel 22 on upper side 18 of body 16. Since the metal coatings of pins 26 are each electrically coupled to respective vias 28, each bond pad 38 of integrated circuit 14 is electrically coupled to the metal coating of a respective pin 26 on lower side 20 of body 16.

Practitioners will appreciate that the number and arrangement of barrels 22 and pins 26 can vary. The arrangement may vary depending, for example, on the number of input/output terminals needed on package 10 to accommodate the particular integrated circuit (or multiple integrated circuits) mounted thereon, or on the configuration of the printed circuit board (or other substrate) on which package 10 is mounted. Barrels 22 and pins 26 may be arranged in a grid array, or in a pair of rows, or in a square pattern, among other possibilities.

Figure 5:
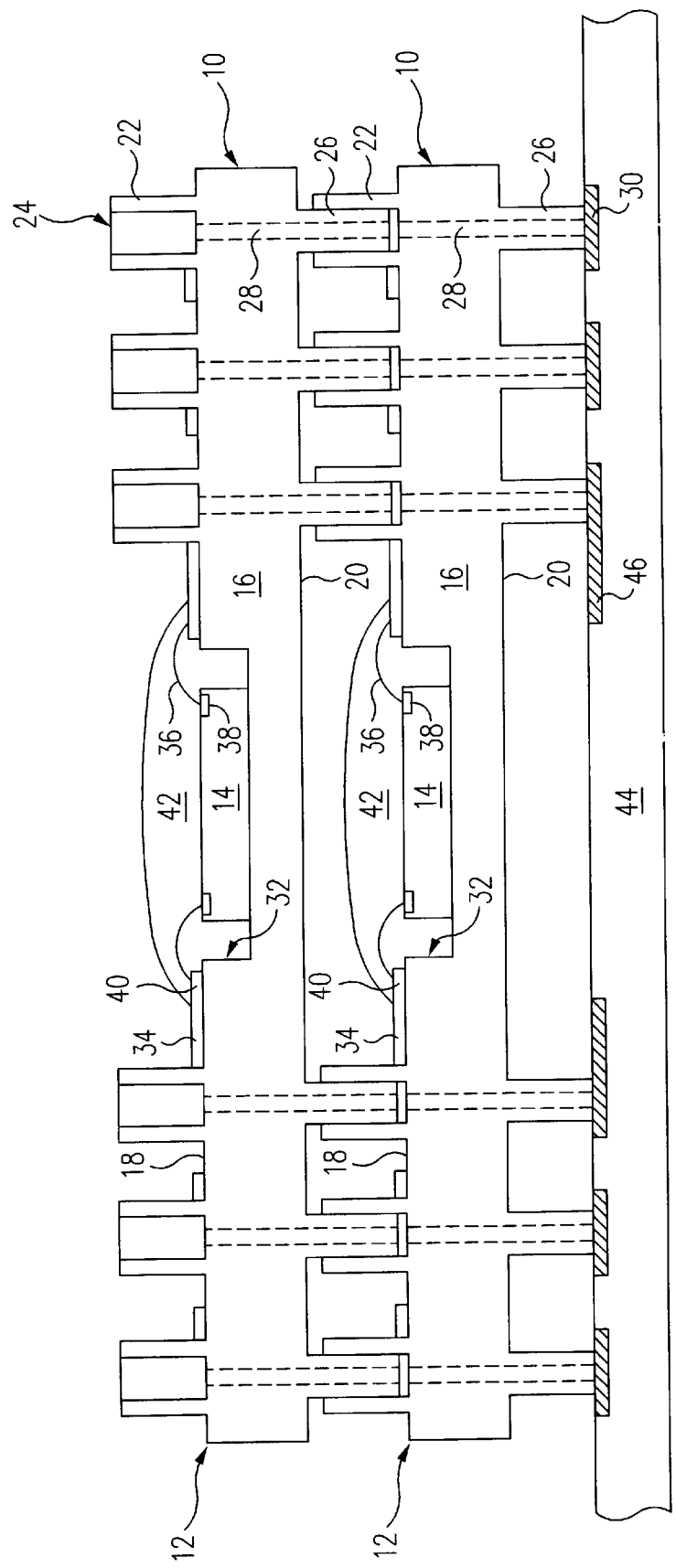
FIG. 5 is a cross-sectional side view of two of the packages of FIG. 1 stacked together and mounted on a printed circuit board.

As mentioned briefly above, the barrel 22 and pin 26 interconnects of package 10 of FIG. 1 enable stacking of multiple packages 10. FIG. 5 is a cross-sectional side view of two packages 10 of FIG. 1 stacked together and mounted on a printed circuit board 44. Each pin 26 of the bottom package 10 is electrically coupled by reflowed solder to a conductive trace 46 on printed circuit board 44. The two packages 10 are arranged one on top of the other and are physically and electrically coupled to each other. The pins 26 of the top package 10 are snugly wedged into respective barrels of the bottom package 10. The two packages 10 are thus electrically coupled in parallel, since each via 28 of the top package 10 is coupled to a respective one of the vias 28 of the bottom package 10. The frictional metal-to-metal contact between the metal coatings of pins 26 of top package 10 and the metal coatings of barrels 22 of bottom package 10 provides an electrical and physical connection between the two packages 10.

The tight engagement between pins 26 of the top package 10 and barrels 22 of the bottom package 10 is enabled by precisely controlling their locations, as well as the inner diameters of barrels 22 and the outer diameters of pins 26. In embodiments where barrels 22 and pins 26 of each package 10 are provided with a slight draft, an even tighter connection between the two packages is possible, since pins 26 of the top package 10 must be snapped into barrels 22 of the bottom package 10. The electrical connection between the two packages 10 can be broken simply by pulling the top package 10 from the lower package 10.

Alternatively, pins 26 and/or barrels 22 can include an outermost solder layer, which can be reflowed after pins 26 of one package 10 are engaged with barrels 22 of another package 10, thereby permanently joining the packages 10.

In the embodiment of FIG. 5, the ends of barrels 22 (at openings 24) of bottom package 10 do not contact lower side 20 of the top package 10. This avoids short-circuiting of barrels 22 of the bottom package 10 to any conductive traces on lower side 20 of the top package 10. In an alternative embodiment, any conductive traces on lower side 20 of packages 10 are sufficiently spaced, or an insulative material is applied over lower side 20, allowing contact between the tops of barrels 22 of the bottom package 10 and lower side 20 of the top package 10.

In the embodiment of FIG. 5, the two packages 10 are arranged with pins 26 of the bottom package 10 soldered to traces 46 on printed circuit board 44. In an alternative embodiment, packages 10 may be oriented so that the integrated circuits 14 of each package in the stack are facing circuit board 44, with barrels 22 of the bottom package 10 of the stack soldered to traces 46 of circuit board 44.

In the embodiment of FIG. 5, the two integrated circuits 14 may each be, for example, a memory device, such as a DRAM, SRAM, or flash memory device. Accordingly, the overall size of the memory could be increased by stacking additional packages 10 on top of the two packages 10 shown stacked in FIG. 5.

In an alternative embodiment, packages with differing types of integrated circuits 14 (e.g., a memory device and a microprocessor), but similar substrates 12, could be stacked one on top of the other. The two packages might have different pin counts, with the smaller pin count package stacked on top of the larger pin count package. The routing of traces 34 might be changed and additional conductive traces could be provided on lower side 20 of one or more of the packages to accommodate electrical interconnection of different integrated circuits 14.

Figure 6:
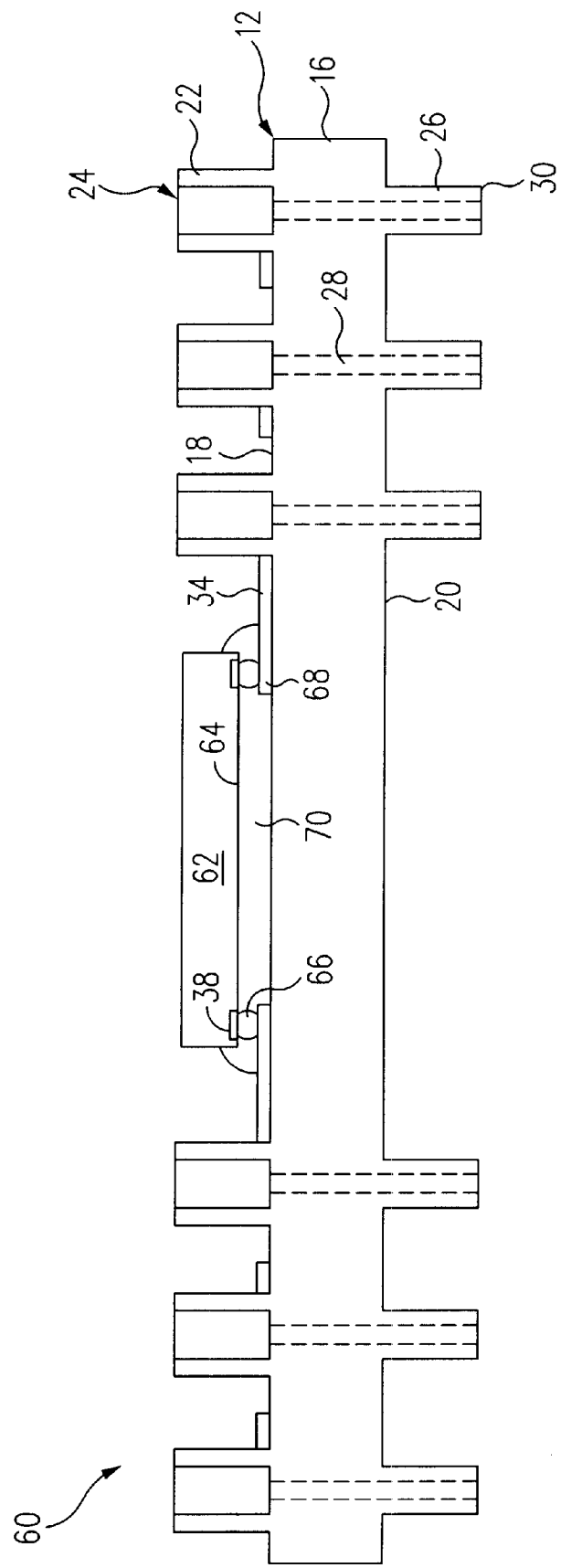
FIG. 6 is a cross-sectional side view of a stackable integrated circuit package in accordance with an alternative embodiment of the present invention.

FIG. 6 is a cross-sectional side view of a stackable integrated circuit package 60 in accordance with an alternative embodiment of the present invention. Package 60 of FIG. 6 is similar to package 10 of FIG. 1, and some features of package 60 have the same reference numbers as similar features of package 10. Accordingly, to avoid redundancy, our discussion will focus on differences between package 60 and package 10.

Package 60 of FIG. 6 includes an integrated circuit mounted in a flip chip configuration. The integrated circuit is denoted as flip chip 62. Flip chip 62 is mounted on upper side 18 of body 16, which in this case is planar and lacks recess 32 of body 16 of package 10 of FIG. 1. Flip chip 62 is mounted with a first surface 64, which includes conductive bond pads 38, facing upper side 18 of body 16, so that flip chip 62 is electrically coupled to traces 34 on upper side 18 of body 16. Each of a plurality of conductive bumps 66 (e.g., solder bumps) electrically couples a respective conductive bond pad 38 of flip chip 62 to a corresponding metal land 68 of a respective trace 34. An electrically insulative, adhesive underfill material 70 is present around flip chip 62 and between first surface 64 of flip chip 62 and upper side 18 of body 16. Underfill material 70 may be omitted. Additionally, or alternatively, a glob of encapsulant (not shown) may be applied over flip chip 62.

Figure 7:
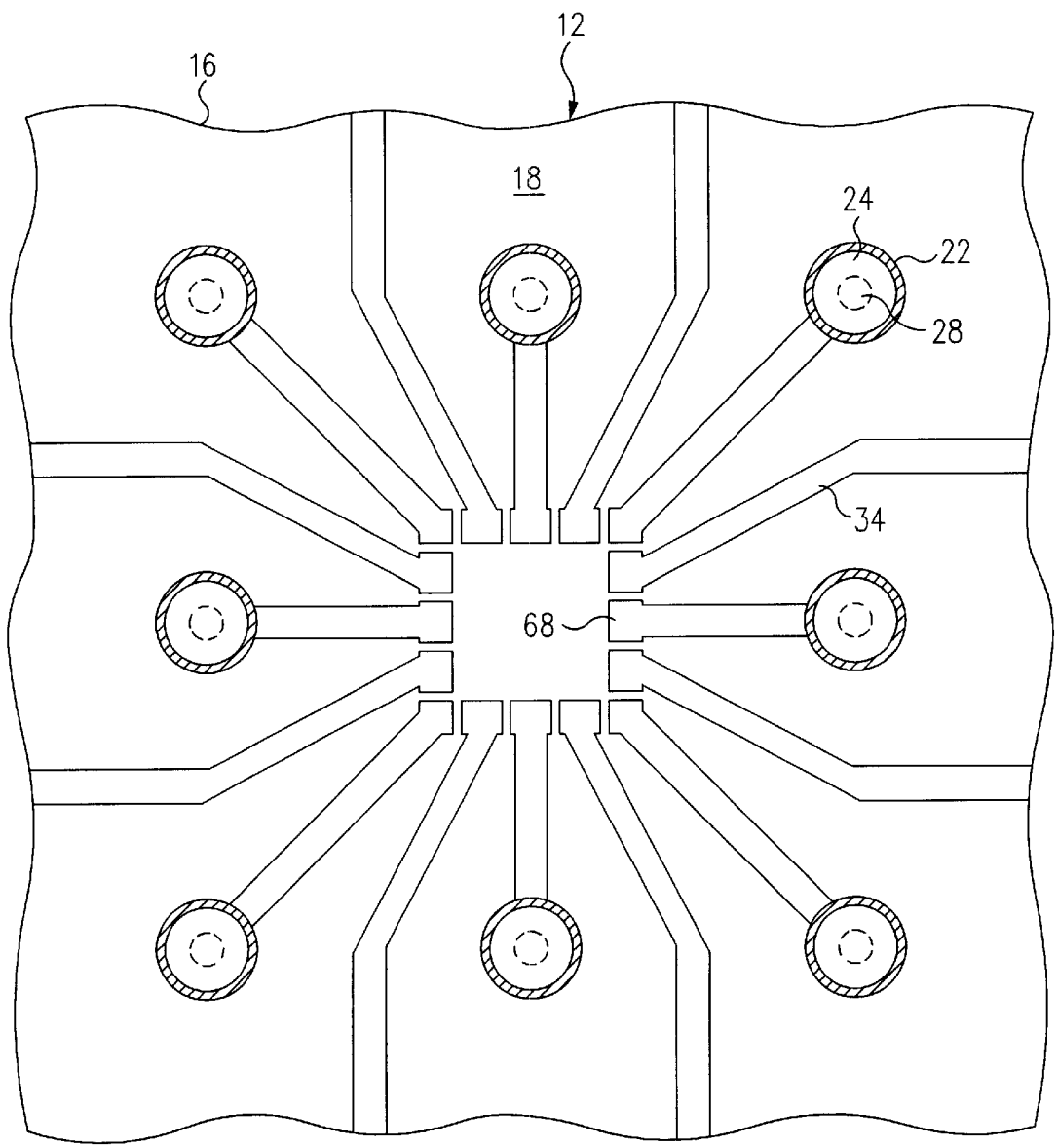
FIG. 7 is a plan view of a subportion of the upper side of the body of the substrate of the package of FIG. 6.

FIG. 7 is a plan view of a subportion of upper side 18 of body 16 of substrate 12 of package 60 of FIG. 6. As shown in FIG. 7, metal lands 68 are formed at the inner ends of traces 34. As with integrated circuit 14 of package 10 of FIG. 1, flip chip 62 of package 60 is electrically connected by traces 34 to the metal coatings of barrels 22 on upper side 18 of body 16. The metal coatings of barrels 22, in turn, are each coupled through respective vias 28 to the metal coatings of respective pins 26 on lower side 20 of body 16.

Package 60 of FIG. 6 is stackable, like package 10 of FIG. 1. A plurality of packages 60 may be placed one on top of the other to form a stack similar to the stack of packages 10 shown in FIG. 5. In some embodiments, one or more packages 60 may be stacked with one or more packages 10.

Figure 8:
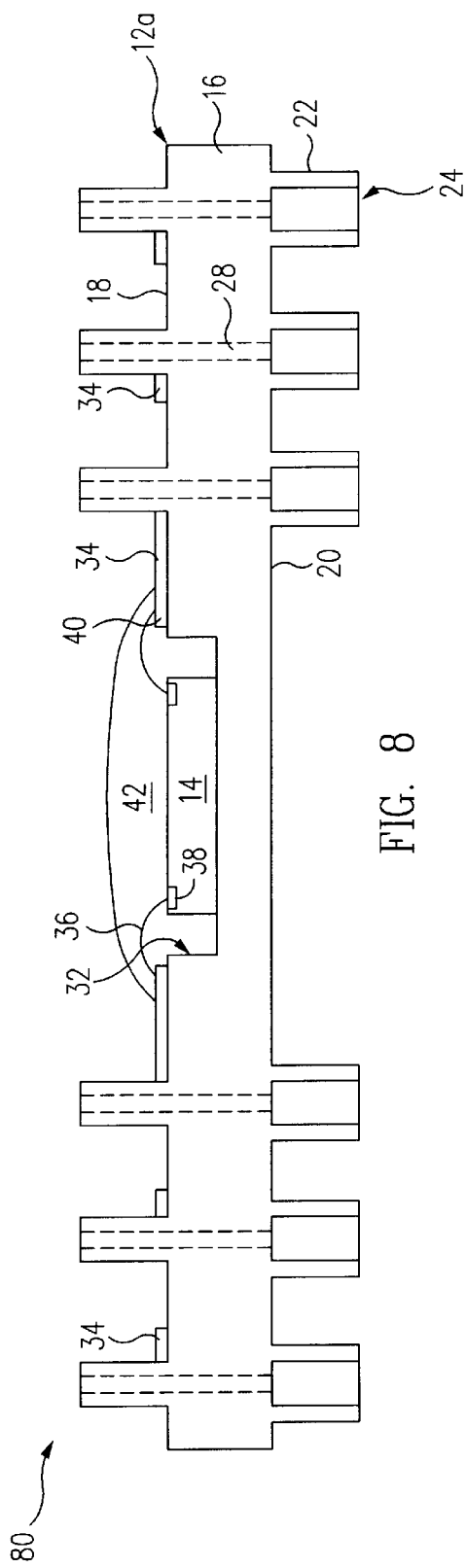
FIG. 8 is a cross-sectional side view of a stackable integrated circuit package in accordance with an alternative embodiment of the present invention.

FIG. 8 is a cross-sectional side view of a stackable integrated circuit package 80 in accordance with an alternative embodiment of the present invention. Package 80 of FIG. 8 is similar to package 10 of FIG. 1, and some features of package 80 have the same reference numbers as similar features of package 10. Accordingly, to avoid redundancy, our discussion will focus on differences between package 80 and package 10. Like substrate 12 of package 10 of FIG. 1, package 80 of FIG. 8 includes a substrate 12*a* with both barrels 22 and pins 26. Unlike in package 10, however, in package 80, barrels 22 project vertically and integrally from lower side 20 of body 16 and pins 26 project vertically and integrally from upper side 18 of body 16.

Package 80 of FIG. 8 is stackable, like package 10 of FIG. 1. A plurality of packages 80 may be placed one on top of the other to form a stack similar to the stack of packages 10 shown in FIG. 5. In some embodiments, one or more packages 80 may be stacked with one or more packages 10, or with one or more packages 60 of FIG. 6.

In order to stack one package 80 on top of one package 10, packages 80 and 10 could be arranged so that the two integrated circuits 14 of packages 80 and 10 face each other. In other words, upper side 18 of substrate 12*a* of package 80 could face upper side 18 of substrate 12 of package 10. In this manner, pins 26 on upper side 18 of substrate 12*a* of package 80 face and engage respective barrels 22 on upper side 18 of substrate 12 of package 10. Alternatively, packages 80 and 10 could be arranged so that the two integrated circuits 14 of packages 80 and 10 face away each other. In this manner, pins 26 on lower side 20 of substrate 12 of package 10 face and engage respective barrels 22 on lower side 20 of substrate 12*a* of package 80.

Figure 9:
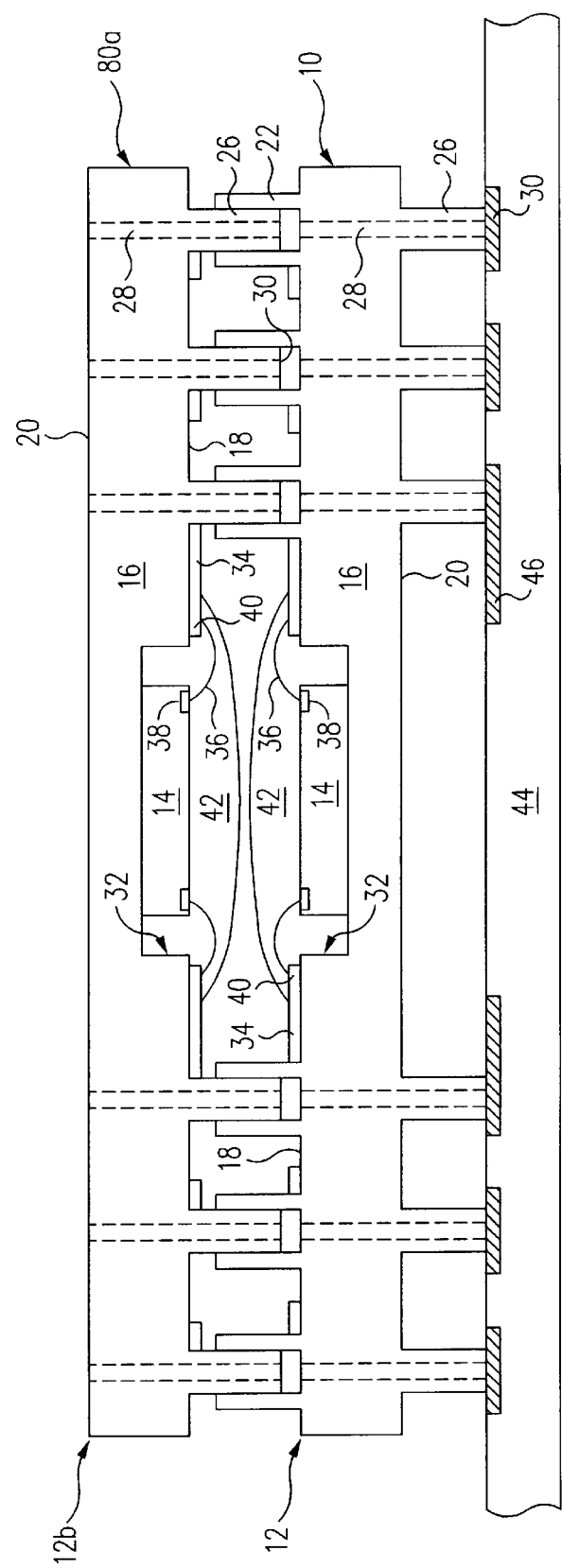
FIG. 9 is a cross-sectional side view of two packages stacked together and mounted on a printed circuit board.

FIG. 9 is a cross-sectional side view of a package 10 and a package 80*a* stacked together and mounted on printed circuit board 44. Each pin 26 of the bottom package 10 is electrically coupled by reflowed solder to a conductive trace 46 on circuit board 44. Package 80*a* is similar to package 80 of FIG. 8. Barrels 22 on lower side 20 of substrate 12*a* of package 80 have been omitted, however, on a substrate 12*b* of package 80*a*.

As discussed above with reference to stacking one package 80 of FIG. 8 on one package 10 of FIG. 1, package 80*a* is oriented with integrated circuit 14 facing integrated circuit 14 of package 10. Pins 26 on upper side 18 of substrate 12*b* of package 80*a* face and engage respective barrels 22 on upper side 18 of substrate 12 of package 10. Package 10 and package 80*a* are thus physically coupled together, as well as electrically coupled in parallel, since the metal coating of each pin 26 of package 80*a* is coupled to the metal coating of a respective pin 26 of package 10 through a via 28 in package 10. Since package 80*a* does not include any barrels 22 (or pins 26) on lower side 20, package 80*a* must be the topmost package in the stack.

In the embodiment of FIG. 9, the two integrated circuits 14 of packages 10 and 80*a* may be similar integrated circuits (e.g., memory chips), or they may be different integrated circuits. For example, integrated circuit 14 of package 80*a* may be a memory chip, while integrated circuit 14 of package 10 may be a microprocessor.

FIG. 10 is a cross-sectional side view of a stackable integrated circuit package 100 in accordance with an alternative embodiment of the present invention. Package 100 of FIG. 10 is similar to package 10 of FIG. 1, and some features of package 100 have the same reference numbers as similar features of package 10. Accordingly, to avoid redundancy, our discussion will focus on differences between package 100 and package 10.

A substrate 12*c* of package 100 does not include any barrels 22, and only pins 26 project vertically and integrally from lower side 20 of body 16. Package 100 is stackable, like package 10 of FIG. 1. Package 100, typically will be the top package in the stack because there are no barrels 22 or pins 26 on upper side 18 of substrate 12*c* of package 100. Thus, one package 100 may be stacked on top of one or more packages 10 of FIG. 1, or one or more packages 60 of FIG. 6, or one or more packages 80 of FIG. 8 (oriented with lower side 20 up).

FIG. 11 is a cross-sectional side view of a stackable integrated circuit package 110 in accordance with an alternative embodiment of the present invention. Package 110 of FIG. 11 is similar to package 80 of FIG. 8 and to package 100 of FIG. 10, and some features of package 110 have the same reference numbers as similar features of packages 80 and 100. Accordingly, to avoid redundancy, our discussion will focus on differences between package 110 and packages 80 and 100.

Like substrate 12*a* of package 80 of FIG. 8, a substrate 12*d* of package 110 includes barrels 22 projecting vertically and integrally from lower side 20 of body 16. Like substrate 12*c* of package 100 of FIG. 10, substrate 12*d* of package 110 does not include any pins 26 or barrels 22 projecting from upper side 18 of body 16. Package 110 is stackable, however, like package 100 of FIG. 10, package 110 must be the top package in the stack. Thus, one package 110 may be stacked on top of one or more packages 10 of FIG. 1 (oriented with lower side 20 up), or one or more packages 60 of FIG. 6 (oriented with lower side 20 up), or one or more packages 80 of FIG. 8.

Figure 12:
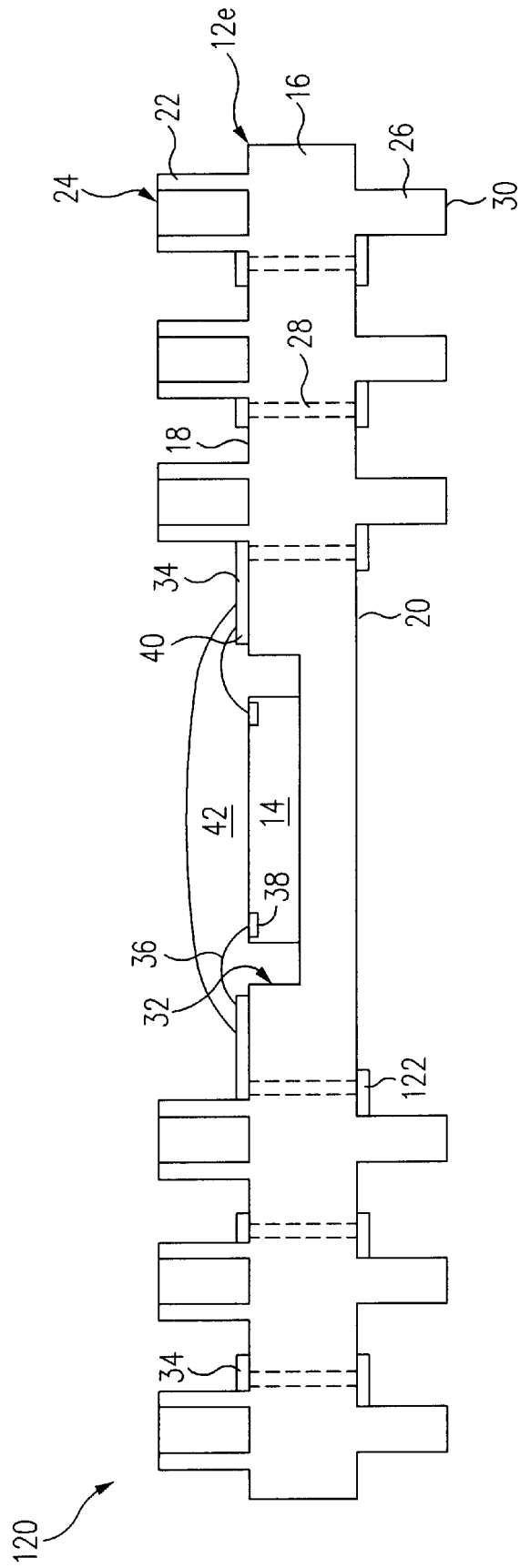
FIG. 12 is a cross-sectional side view of a stackable integrated circuit package in accordance with an alternative embodiment of the present invention.

FIG. 12 is a cross-sectional side view of a stackable integrated circuit package 120 in accordance with an alternative embodiment of the present invention. Package 120 of FIG. 12 is similar to package 10 of FIG. 1, and some features of package 120 have the same reference numbers as similar features of package 10. Accordingly, to avoid redundancy, our discussion will focus on differences between package 120 and package 10.

Like substrate 12 of package 10, substrate 12*e* of package 120 includes barrels 22 projecting from upper side 18 of body 16 and pins 26 projecting from lower side 20 of body 16. Respective metal coatings in barrels 22 and on pins 26 are electrically coupled together by vias 28 extending through body 16. Unlike substrate 12 of package 10, however, vias 28 of substrate 12*e* of package 120 are not in coaxial alignment with respective barrels 22 and pins 26, but rather are displaced from barrels 22 and pins 26. For example, each via 28 may be located next to a respective barrel 22 and a respective pin 26. In this case, conductive traces 34 on upper side 18 electrically couple each via 28 to a respective barrel 22. A plurality of conductive traces 122 on lower side 20 electrically couple each via 28 to a respective pin 26. Conductive traces 122 on lower side 20 of substrate 12*e* may be elongated traces similar to traces 34 on upper side 18 (see, for example, FIG. 3). Alternatively, traces 122 may be extensions of the metal coatings on respective pins 26, which extend from the outer sidewalls of pins 26 onto lower side 20 immediately surrounding pins 26.

Since barrels 22 and pins 26 of package 120 of FIG. 12 are configured similarly to package 10 of FIG. 1, package 120 may be stacked in any manner discussed above with reference to package 10 of FIG. 1.

Figure 13:
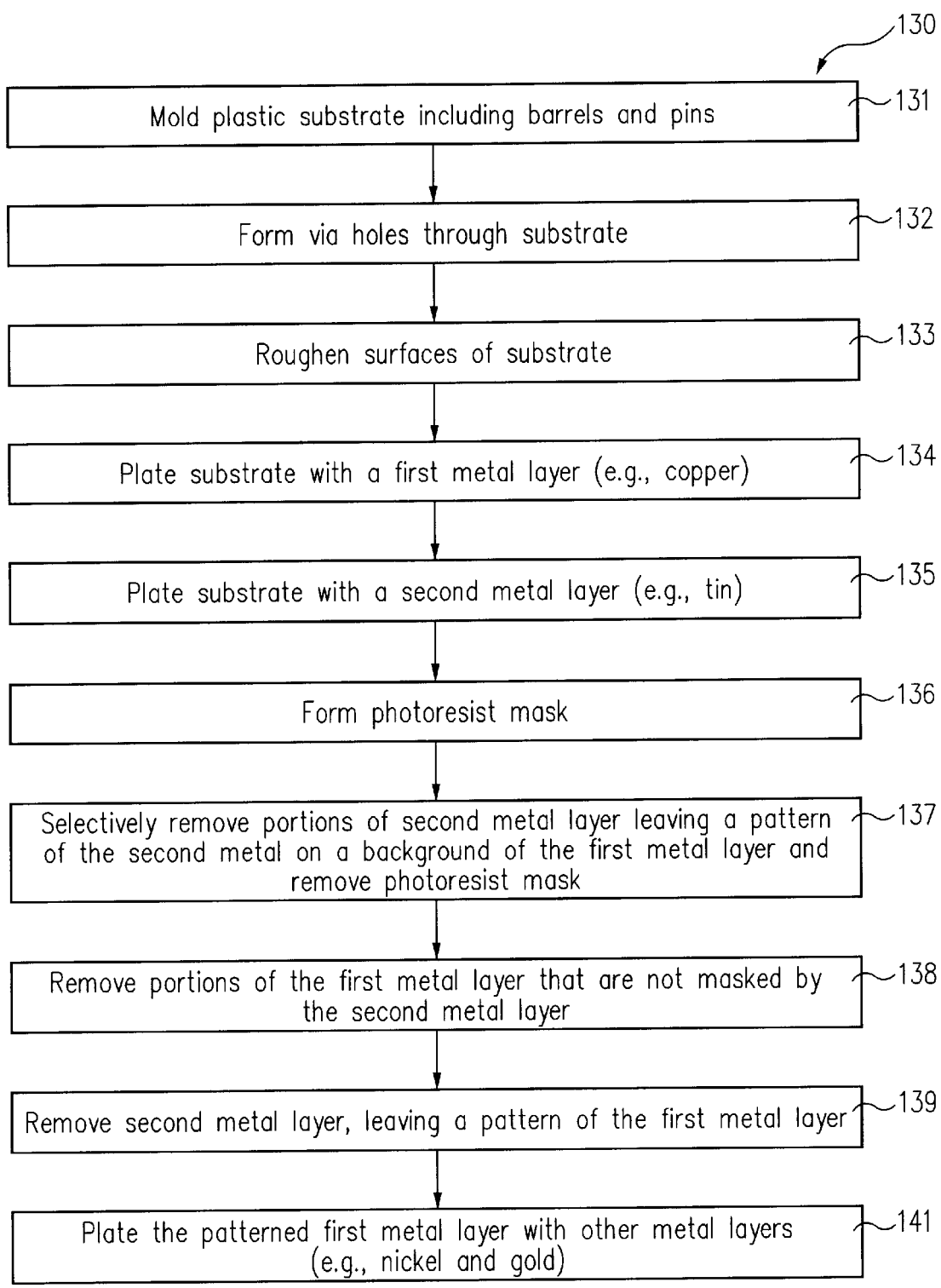
FIG. 13 is a flow chart outlining a method, in accordance with an embodiment of the present invention, of making the substrate for the packages of FIG. 1 and FIG. 6.

FIG. 13 is a flow chart outlining a method 130, in accordance with an embodiment of the present invention, of making substrate 12 for packages 10 and 60 of FIG. 1 and FIG. 6, respectively. In step 131, substrate 12 is formed, for example, by injection molding a plastic material, such as liquid crystal polymer (LCP) or another insulative plastic material. LCP is capable of sustaining high temperatures and is easily molded. The plastic body 16 of substrate 12 is molded along with coaxial barrels 22 and pins 26. Depending on the embodiment, recess 32 may be formed in upper side 18 of body 16 to receive an integrated circuit 14 in a later step. Substrate 12 may be formed individually, or as part of an integral matrix of substrates 12 that will later be cut apart.

In step 132, holes are each formed through body 16 and one pin 26 coaxial with a respective barrel 22. The holes are each formed between upper side 18 of body 16 and end 30 of a respective pin 26. The holes are for forming vias 28. The holes may be punched or drilled, for example, using a computer-controlled laser drill.

In step 133, the surfaces of substrate 12 are roughened to aid adhesion of a metal layer to substrate 12 in a subsequent metal plating step. One way to roughen the surfaces of substrate 12 is to expose substrate 12 to a plasma that includes, for example, a fluorocarbon gas or some other fluorine gas, to form numerous very small asperities on the surfaces of substrate 12.

In step 134, all surfaces of substrate 12 are plated with a first metal layer, which may be, for example, copper. The holes formed through substrate 12 are also plated with copper to form vias 28. The copper may be plated onto substrate 12 using an electroless plating process. Surface roughness induced in step 133 promotes adhesion of the copper layer to substrate 12.

In step 135, the surfaces of substrate 12 are plated with a second layer of metal, which may be tin or another metal.

In step 136, a photoresist mask is formed and patterned on upper side 18 and lower side 20 of body 16. The photoresist mask fully covers barrels 22 and pins 26. The particular process of forming the photoresist mask may vary. In an exemplary process, a photoresist material is applied to substrate 12 and then baked. Next, the photoresist material is exposed to light of a specified frequency through a reticle. The light exposes the photoresist. Subsequently, a developer is applied to the photoresist so that the nonexposed photoresist material may be removed, leaving a patterned photoresist mask on susbtrate 12.

In step 137, the tin is etched through openings in the photoresist mask, using a liquid chemical etchant, or a plasma etchant, with a high selectivity for tin over copper. After etching the exposed tin, the photoresist mask is removed. As a result, patterns of tin are left on the copper background. In particular, tin remains on barrels 22, pins 26, and in the areas where traces 34 and leadfingers 40 or metal lands 68 are desired. Conventional etch methods allow the formation of 0.01 mm wide tin lines and 0.01 mm wide spaces between the tin lines, although differently-sized lines and spaces may be used.

In step 138, the copper is removed from all areas of substrate 12 that are not covered by the tin pattern. The tin thus acts as a mask during step 138. The copper may be removed, for example, by exposing the uncovered copper areas of substrate 12 to a laser tuned to vaporize the copper without vaporizing the tin. Alternatively, the photoresist mask from step 137 may be left on substrate 12 and the copper may be removed using a liquid chemical, or plasma, etchant. As a result of step 138, traces 34, and leadfingers 40 or lands 68, are defined on substrate 12. In addition, metal coatings, which include a first layer of copper covered by a second layer of tin, are defined on barrels 22 and pins 26. Traces 34 are coupled to the metal coatings of respective barrels 22. Recall vias 28 also are also coated with copper, thereby electrically coupling the metal coatings of barrels 22 to the metal coatings of respective pins 26.

In step 139, the tin is removed from substrate 12. The tin may be removed by chemical or plasma etching, using an etchant with a high selectivity for tin over copper.

In step 141, the remaining copper on substrate 12 is optionally plated (e.g., by electroless plating) with additional metal layers, such as an intermediate layer of nickel and a top layer of gold. Nickel promotes the adhesion of the gold to the copper. Gold facilitates bonding of an integrated circuit to traces 34. In addition, friction between the gold layers in barrels 22 and on pins 26 helps hold stacked packages 10 together (see, for example, FIG. 5). At the conclusion of step 141, substrate 12 is fully formed and ready for assembly into a package, such as package 10 of FIG. 1.

A vendor of equipment believed to be capable of performing method 130 is Siemens Energy and Automation, Inc., which has offices in Germany; Austin, Tex.; and Atlanta, Ga.

In an alternative embodiment of a method of making substrate 12 for packages 10 and 60 of FIG. 1 and FIG. 6, respectively, the tin mask layer is not used. In this case, steps 135, 137, and 139 of method 130 are omitted, and a conventional photolithography process is used to pattern the first metal layer directly. For example, a photoresist layer could be used as a mask during liquid chemical, or plasma, etching of the unwanted portions of the copper layer.

Substrates 12a, 12b, 12c, 12d, and 12e of the packages of FIGS. 8, 9, 10, 11, and 12, respectively, could be made by methods similar to method 130 outlined in FIG. 13. Our discussion focuses on notable differences in the fabrication methods. As discussed previously with respect to these embodiments, substrates 12b, 12c, and 12d of FIGS. 9, 10, and 11, respectively, do not include both barrels 22 and pins 26. The molding of these substrates in step 131 would, therefore, only include barrels 22 or pins 26 as required by the specific embodiment. Step 132 (formation of via holes) may be omitted for substrate 12b of FIG. 9. The via holes formed in step 132 for substrate 12e of FIG. 12 would be formed only through body 16, since vias 28 of substrate 12e are not co-axially aligned with barrels 22 and pins 26. Conductive traces 122 on lower side 20 of body 16 of substrate 12e of FIG. 12 may be formed along with traces 34 on upper side 18 of body 16 using steps 136 through 141 of method 130.

Figure 14:
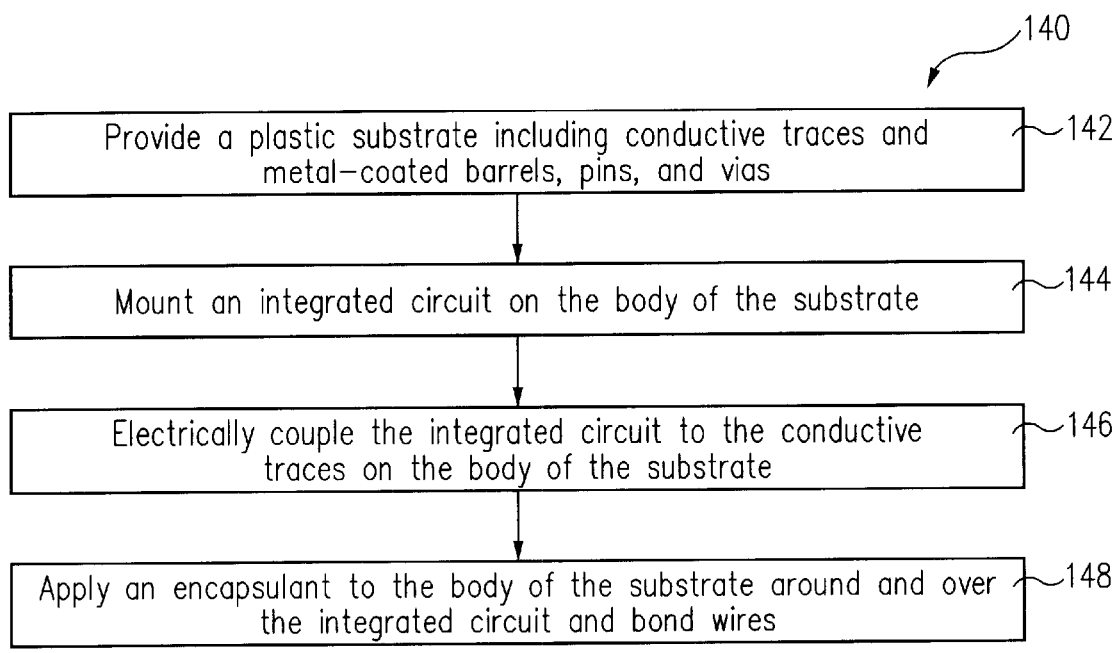
FIG. 14 is a flow chart outlining a method, in accordance with an embodiment of the present invention, of making the package of FIG. 1.

FIG. 14 is a flow chart outlining a method 140, in accordance with an embodiment of the present invention, of making package 10 of FIG. 1. In step 142, a substrate 12, which is molded of a plastic material, is provided. Substrate 12 includes conductive traces 34 coupled to metal-coated coaxial barrels 22, pins 26, and vias 28. Substrate 12 may be formed, for example, by method 130 of FIG. 13. In step 144, integrated circuit 14 is mounted in recess 32 of upper side 18 of body 16 of substrate 12. If substrate 12 does not include a recess 32, then integrated circuit 14 is centrally mounted on upper side 18. A conventional die attach adhesive or adhesive film may be used to attach integrated circuit 14 to body 16.

In step 146, integrated circuit 14 is electrically coupled to traces 34 of substrate 12 by coupling bond wires 36 between bond pads 38 of integrated circuit 14 and leadfingers 40 of traces 34. Conventional bond wire materials (e.g., gold), wiring methods, and equipment may be used. In step 148, encapsulant 42 is formed over integrated circuit 14, bond wires 36, and leadfingers 40 by applying an insulative encapsulant material onto upper side 18 of body 16. A glob top, liquid encapsulation, or molding method may be used to apply encapsulant 42.

Packages 60, 80, 80a, 100, 110, and 120 of FIGS. 6, 8, 9, 10, 11, and 12, respectively, may be made by a method similar to method 140 outlined in FIG. 14, which was used to make package 10 of FIG. 1. Our discussion focuses on notable differences in the fabrication methods. In step 142, an appropriate substrate for the specific embodiment would be required. As discussed above, the substrates may be made by a method similar to method 130, outlined in FIG. 13. In an exemplary method of package assembly for package 60 of FIG. 6, bond pads 38 of flip chip 62 are directly mounted on lands 68 and electrically connected thereto by solder in steps 144 and 146. Subsequently, in step 148, underfill material 70 is applied onto upper side 18 around flip chip 62. Underfill material 70 wicks in under flip chip 62.

In some alternative embodiments of packages 80, 80a, 100, 110, and 120 of FIGS. 8, 9, 10, 11, and 12, respectively, it is possible that integrated circuit 14 may be mounted using the flip chip configuration described for package 60 of FIG. 6. In these embodiments, the package assembly would be similar to that described above for package 60 of FIG. 6.

An alternative method of making substrates 12, 12a, 12b, 12c, 12d, and 12e, and packages 10, 60, 80, 80a, 100, 110, and 120 of FIGS. 1, 6, 8, 9, 10, 11, and 12, respectively, is to make a plurality of substrates (and, subsequently, packages) in parallel. Typically, multiple packages with similar substrates are made in parallel. In such an embodiment, a molded sheet of plastic material consisting of an array of interconnected package sites is formed. Each package site of the sheet would include a substrate for the specific package embodiment being packaged. A method similar to method 130 of FIG. 13 could be used to form the sheet, including all package sites of the sheet. Next, a package assembly method similar to method 140 of FIG. 14, or similar to the flip chip mounting method discussed above, could be performed in parallel for each package site of the sheet. Finally, the package sites of the sheet would be singulated to form individual packages. One way to singulate assembled packages from the sheet would be to vertically cut through the sheet between the package sites using a saw or laser.

Figure 15:
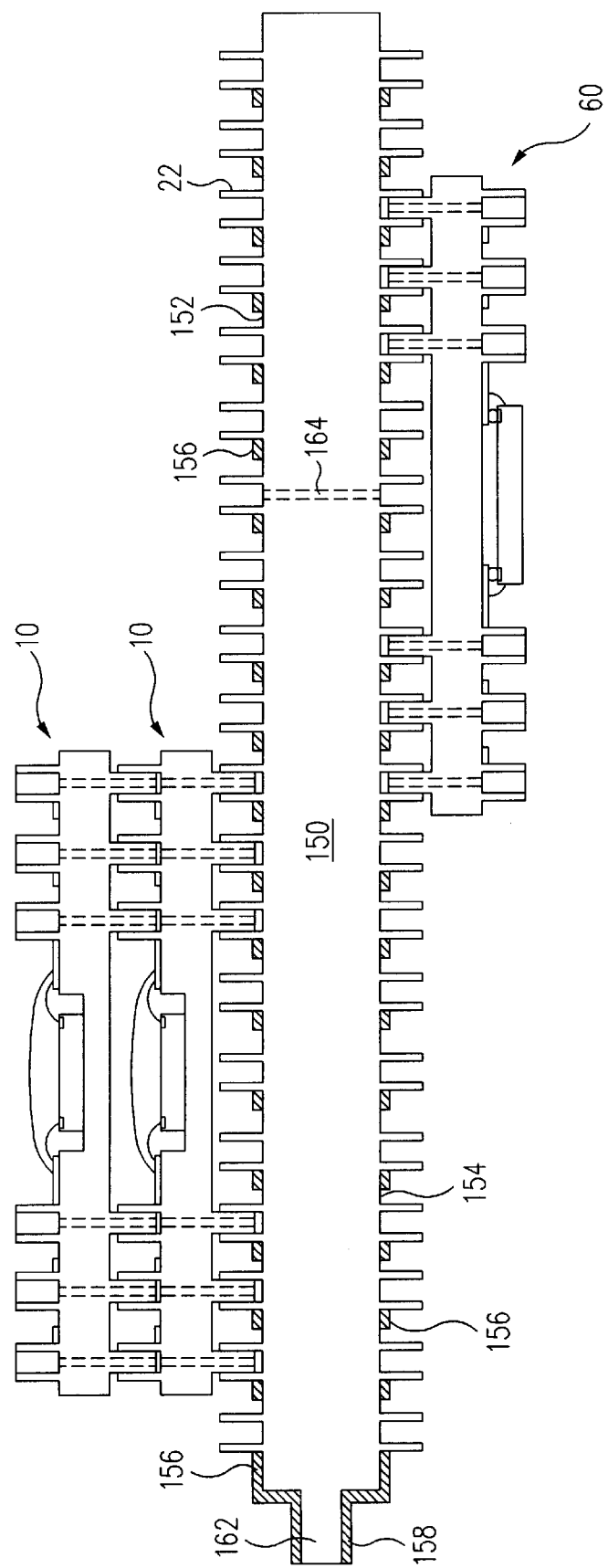
FIG. 15 is a cross-sectional side view of a plastic mounting substrate that may be used for mounting packages disclosed herein in accordance with the present invention.

FIG. 15 is a cross-sectional side view of a plastic mounting substrate 150 that may be used (instead of printed circuit board 44 of FIG. 5) for mounting packages disclosed herein in accordance with the present invention. Unlike the embodiment of FIG. 5, where ends 30 of pins 26 of the bottom package 10 were soldered to conductive traces 46 of printed circuit board 44, mounting substrate 150 includes metal-coated barrels 22 like those on upper side 18 of body 16 of package 10 of FIG. 1. In particular, mounting substrate 150 includes an upper side 152 and an opposite lower side 154. Metal-coated barrels 22 extend vertically from both sides 152 and 154.

Two stacked packages 10 of FIG. 1 are shown mounted on upper side 152 of mounting substrate 150. One package 60 of FIG. 6 is shown mounted on lower side 154 of mounting substrate 150. Pins 26 on lower sides 20 of each of the bottom package 10 and package 60 are engaged with barrels 22 on upper and lower sides 152 and 154 of mounting substrate 150.

Mounting substrate 150 also includes a plurality of conductive traces 156 on each of upper and lower sides 152 and 154. First ends of traces 156 are electrically connected to respective barrels 22 on mounting substrate 150. The opposite end of some or all of traces 156 may be electrically connected to a metal terminal 158 of an edge connector 162 of mounting substrate 150. Edge connector 162 may, in turn, be inserted into an interconnection receptacle on a motherboard or in an electronic chassis. Mounting substrate 150 may include a single edge connector 162 with one or more metal terminals 158. Alternatively, mounting substrate 150 may include a plurality of edge connectors 162, each with one or more metal terminals 158.

Alternatively, the opposite ends of some traces 156 may electrically connect to other barrels 22 on the same side of mounting substrate 150 so that packages, or stacks of packages, mounted on the same side (e.g., upper side 152 or lower side 154) of mounting substrate 150 may be interconnected. In addition, a plurality of vias 164 may extend through mounting substrate 150 to electrically connect traces 156 on upper side 152 to traces 156 on lower side 154. In this manner, packages (or stacks of packages) mounted on upper side 152 of mounting substrate 150 may be electrically connected to packages (or stacks of packages) mounted on lower side 154 of mounting substrate 150. Accordingly, packages 10 or 60 shown mounted on mounting substrate 150 in FIG. 15 may be electrically connected to each other, and they may be electrically connected to external circuitry through edge connector 162.

When mounting substrate 150 of FIG. 15 is used instead of printed circuit board 44 of FIG. 5, packages 10 and 60 (or stacks of packages 10 and/or 60) may be directly mounted onto sides 152 and 154 of mounting substrate 150 as shown in FIG. 15. Pins 26 of the bottom package 10 or 60 of the stacks are engaged with, and thereby electrically connected to, respective barrels 22 of mounting substrate 150. Accordingly, there is no need for a soldered interconnection between mounting substrate 150 and packages 10 or 60 mounted thereon. This gives the user maximum flexibility and convenience in mounting various, possibly stacked, packages on mounting substrate 150, and also provides the capability of easily removing and replacing the packages. Of course, an alternative embodiment may include coating pins 26 of one or more of the packages with solder, and reflowing the solder after mounting the package(s) on mounting substrate 150. This would result in a permanent connection between pins 26 of the package(s) and barrels 22 of mounting substrate 150.

In the embodiment of FIG. 15, two stacked packages 10 of FIG. 1 and one package 60 of FIG. 6 are shown mounted on mounting substrate 150. In alternative embodiments, however, any package with pins 26 could be mounted on mounting substrate 150. For example, packages 100 and 120 of FIGS. 10 and 12, respectively, could be mounted on mounting substrate 150. In fact, packages 80 and 80a of FIGS. 8 and 9, respectively, could also be mounted on mounting substrate 150, as long as packages 80 and 80a are oriented so that integrated circuits 14 of packages 80 and 80a are facing mounting substrate 150.

In an alternative embodiment, mounting substrate 150 could be molded to include plurality of pins 26 instead of barrels 22 on upper and lower sides 152 and 154. In this embodiment, any package with barrels 22 could be mounted on mounting substrate 150, with barrels 22 of the package engaging pins 26 of mounting substrate 150. For example, packages 80 and 110 of FIGS. 8 and 11, respectively, could be mounted on mounting substrate 150. In fact, packages 10, 60, and 120 of FIGS. 1, 6, and 12, respectively, could also be mounted on mounting substrate 150, as long as packages 10, 60, and 120 are oriented so that integrated circuits 14 of packages 10, 60, and 120 are facing mounting substrate 150.

Embodiments of mounting substrate 150 (e.g., see FIG. 15) may be made by a method similar to method 130 of FIG. 13. Only notable differences in the fabrication methods are discussed here. In step 131 of method 130, mounting substrate 150 could be injection molded with only barrels 22, or only pins 26, or a combination of both barrels 22 and pins 26 (perhaps on opposite sides 152 and 154 of mounting substrate 150). Step 132 of method 130 may be omitted if mounting substrate 150 does not include vias 164. As discussed above with respect to FIG. 13, traces 156 on mounting substrate 150 may be formed with the tin mask described in method 130, or by patterning the copper layer with a conventional photolithography process.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. An integrated circuit package comprising:
   a plastic body;
   a plurality of metal coated plastic barrels each extending vertically and integrally from said body;
   a plurality of metal coated plastic pins each extending vertically and integrally from said body and aligned co-axially with a respective one of said barrels, wherein at least some of said barrels are electrically coupled to respective ones of said pins;
   plurality of electrically conductive traces each electrically coupled to at least one said barrel; and
   an integrated circuit mounted on said body and electrically coupled to at least some of said traces.

2. The integrated circuit package of claim 1, wherein said body includes a first side and an opposite second side, said barrels extending vertically only from said first side and said pins extending vertically only from said second side.

3. The integrated circuit package of claim 2, wherein said conductive traces include metal traces on one or both of said first and second sides.

4. The integrated circuit package of claim 1, further comprising a plurality of metal coated vias each extending through said body and electrically coupling a respective one of said metal coated barrels to a respective one of said metal coated pins.

5. The integrated circuit package of claim 4, wherein each of said vias is aligned co-axially with a respective one of said barrels and a respective one of said pins.

6. The integrated circuit package of claim 4, wherein each of said vias is electrically coupled between a first conductive trace on a first side of the body and a second conductive trace on a second side of the body, said first and second conductive traces being electrically coupled to respective ones of said barrels and said pins.

7. The integrated circuit package of claim 1, wherein an outer diameter of each of said pins is sized to fit snugly within an inner diameter of each of said barrels.

8. The integrated circuit package of claim 1, wherein an inner sidewall of each of said barrels is perpendicular to said body and an outer sidewall of each of said pins is perpendicular to said body.

9. The integrated circuit package of claim 1, wherein an inner sidewall of each of said barrels includes a slight draft referenced to a surface of said body, and an outer sidewall of each of said pins includes an opposite draft to said slight draft of said inner sidewall of a respective one of said barrels.

10. The integrated circuit package of claim 1, further comprising a plurality of bond wires each electrically coupled between said integrated circuit and at least some of said traces.

11. The integrated circuit package of claim 1, further comprising an encapsulant material covering at least a part of said integrated circuit.

12. The integrated circuit package of claim 1, wherein said integrated circuit comprises a flip chip.

13. A stack of integrated circuit packages, the stack comprising:
   a first integrated circuit package including a first integrated circuit mounted on a first plastic body, said first plastic body including a plurality of integral metal coated plastic barrels each electrically coupled to said first integrated circuit; and
   a second integrated circuit package including a second integrated circuit mounted on a second plastic body, said second plastic body including a plurality of integral metal coated pins each electrically coupled to said second integrated circuit,
   wherein said first and second integrated circuit packages are stacked, and said pins of said second integrated circuit package are within and electrically coupled to respective ones of said barrels of said first integrated circuit package.

14. The stack of claim 13, wherein said barrels of said first integrated circuit package are on a same side of said first plastic body as said first integrated circuit, and said pins of said second integrated circuit package are on a same side of said second plastic body as said second integrated circuit.

15. The stack of claim 13, wherein a one of said barrels or said pins are respectively on a same side of said first or second plastic body as said first or second integrated circuit, and an other of said barrels or said pins are respectively on a opposite side of said first or second plastic body as said first or second integrated circuit.

16. The stack of claim 13, wherein said barrels of said first plastic body of said first integrated circuit package are located on a first side of said first plastic body, and said first plastic body further includes a plurality of metal coated plastic pins extending integrally from an opposite second side of said first plastic body, each said pin of said first plastic body being coaxial with and electrically coupled to a respective one of said barrels of said first plastic body, and
   wherein said pins of said second plastic body of said second integrated circuit package are located on a first side of said second plastic body, and said second plastic body further includes a plurality of metal coated plastic barrels extending integrally from an opposite second side of said second plastic body, each said barrel of said second plastic body being coaxial with and electrically coupled to a respective one of said pins of said second plastic body.

17. The stack of claim 16, wherein at least one of said first or second integrated circuit packages further includes a plurality of metal coated vias each extending through the respective first or second plastic body, each said via electrically coupling a respective one of said barrels of the respective first or second plastic body to a respective one of said pins of the respective first or second plastic body.

18. An integrated circuit package comprising:
    a plastic body;
    a plurality of metal coated plastic pins each extending vertically and integrally from said body;
    a plurality of electrically conductive traces on a surface of said body, each electrically conductive trace being electrically coupled to at least one of said pins; and
    an integrated circuit mounted on a surface of said body and electrically coupled to at least some of said pins through respective ones of said electrically conductive traces.

19. The integrated circuit package of claim 18, further comprising a means for receiving and forming an electrical connection with said pins of a second said integrated circuit package.

20. The integrated circuit package of claim 18, wherein said electrically conductive traces are formed of metal.

21. The integrated circuit package of claim 18, wherein said body further comprises a plurality of metal coated plastic barrels extending integrally from said body, said barrels being sized to receive a metal coated pin of a second said integrated circuit package.

22. The integrated circuit package of claim 21, wherein said body includes a first side and an opposite second side, said barrels extending only from said first side and said pins extending only from said second side.

23. The integrated circuit package of claim 21, further comprising a plurality of vias each extending through said body, wherein respective ones of said barrels are electrically coupled to respective ones of said pins through said vias.

24. The integrated circuit package of claim 23, wherein each of said vias is aligned co-axially with a respective one of said barrels and a respective one of said pins.

25. The integrated circuit package of claim 23, wherein each of said vias is electrically coupled between a first conductive trace on a first side of the body and a second conductive trace on a second side of the body, said first and second conductive traces being electrically coupled to respective ones of said barrels and said pins.

26. The integrated circuit package of claim 18, further comprising a plurality of metal coated vias each extending through said body, with each said via electrically coupled between a respective one of said pins and an input/output terminal of the package.

27. The integrated circuit package of claim 18, wherein said body includes a plurality of metal coated apertures sized to receive said pins of a second said integrated circuit package.

28. An integrated circuit package comprising:
    a plastic body;
    a plurality of metal coated plastic barrels formed integrally with said body;
    a plurality of electrically conductive traces on a surface of said body and electrically coupled to at least one metal barrel; and
    an integrated circuit mounted on a surface of said body and electrically coupled to at least some of said barrels through respective ones of said electrically conductive traces.

29. The integrated circuit package of claim 28, wherein said barrels extend vertically from said body.

30. The integrated circuit package of claim 28, further comprising a means for engaging and forming an electrical connection with said barrels of a second said integrated circuit package.

31. The integrated circuit package of claim 28, wherein said body further comprises a plurality of metal coated plastic pins extending integrally and vertically from said body.

32. The integrated circuit package of claim 31, wherein said body includes a first side and an opposite second side, said barrels are only on said first side and said pins are only on said second side.

33. The integrated circuit package of claim 32, further comprising a plurality of vias each extending through said body, with each via being electrically coupled between a respective one of said barrels and a respective one of said pins.

34. The integrated circuit package of claim 33, wherein each of said vias is aligned co-axially with a respective one of said barrels and a respective one of said pins.

35. An integrated circuit package comprising:
    a plastic body with electrically conductive traces thereon;
    an integrated circuit mounted on a surface of said body and electrically coupled to at least some of said electrically conductive traces;
    a means integral with said plastic body and electrically coupled to the electrically conductive traces for stacking said package with a second said integrated circuit package and for electrically coupling the integrated circuit to said second integrated circuit package,
    wherein said means comprises coated plastic pins extending vertically and integrally from said package body, said pins being coated with an electrically conductive material.

36. The integrated circuit package of claim 35, wherein said means comprises metal coated apertures in said package body.

37. The integrated circuit package of claim 35, wherein said means comprises metal coated plastic barrels extending vertically and integrally from said package body.

* * * * *